(12) United States Patent
Chen et al.

(10) Patent No.: US 9,310,435 B2
(45) Date of Patent: Apr. 12, 2016

(54) SCAN FLIP-FLOP AND ASSOCIATED METHOD

(71) Applicants: GLOBAL UNICHIP CORPORATION, Hsinchu (TW); TAIWAN SEMICONDUCTOR MANUFACTURING CO., LTD., Hsin-Chu (TW)

(72) Inventors: Sho-Mo Chen, Yilan County (TW); Chien-Cheng Wu, New Taipei (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/519,484

(22) Filed: Oct. 21, 2014

(65) Prior Publication Data

US 2015/0113345 A1    Apr. 23, 2015

(30) Foreign Application Priority Data

Oct. 21, 2013   (TW) .................................. 102137974

(51) Int. Cl.
 *H03K 3/00* (2006.01)
 *G01R 31/3185* (2006.01)
(52) U.S. Cl.
 CPC .............................. *G01R 31/318541* (2013.01)

(58) Field of Classification Search
None
See application file for complete search history.

(56) References Cited

U.S. PATENT DOCUMENTS

| | | | |
|---|---|---|---|
| 5,173,626 A | 12/1992 | Kudou et al. | |
| 5,633,606 A | 5/1997 | Gaudet et al. | |
| 6,289,477 B1* | 9/2001 | Gunadisastra | G01R 31/318541 324/750.3 |
| 6,389,566 B1 | 5/2002 | Wagner et al. | |
| 6,895,540 B2 | 5/2005 | Chen et al. | |
| 7,649,395 B2 | 1/2010 | Ahmadi | |
| 8,866,528 B2* | 10/2014 | Lin | H03K 3/356156 327/202 |
| 2014/0125377 A1* | 5/2014 | Lin | H03K 3/356121 326/16 |
| 2014/0129887 A1* | 5/2014 | Lin | G01R 31/318541 714/729 |

\* cited by examiner

*Primary Examiner* — Long Nguyen
(74) *Attorney, Agent, or Firm* — WPAT, P.C.; Justin King

(57) ABSTRACT

Scan flip-flop and associated method are provided. The scan flip-flop includes a data input terminal, a scan input terminal, a flip-flop circuit, a first transistor and a plurality of second transistors. A gate of the first transistor is coupled to the scan input terminal, gates of the second transistors are commonly coupled to an enabling signal, drains and sources of the first transistor and the second transistors are serially coupled to the flip-flop circuit, so as to increase a delay between the scan input terminal and the flip-flop circuit.

3 Claims, 4 Drawing Sheets

SCAN FLIP-FLOP AND ASSOCIATED METHOD

This application claims the benefit of Taiwan Patent Application No. 102137974, filed Oct. 21, 2013, the subject matter of which is incorporated herein by reference.

FIELD OF THE INVENTION

The present invention relates to a scan flip-flop and associated method, and more particularly, to a scan flip-flop and associated method capable of providing effective solution to hold-time violation.

BACKGROUND OF THE INVENTION

Semiconductor integrated circuit (IC, e.g., chip, die, etc.) is formed by many circuitry cells, and scan flip-flop is one of the most frequently adopted standard cells. Scan flip-flop may switch between a normal operation mode and a scan test mode; architecture of scan flip-flop may be equivalent to a multiplexer and an ordinary flip-flop circuit (e.g., a master-slave flip-flop). The multiplexer may have a data input terminal and a scan input terminal, and may respectively conduct the data input terminal and the scan input terminal to the flip-flop circuit during the normal operation mode and the scan test mode; hence, under triggering of a clock, the flip-flop circuit may latch and sample a signal which is selected to be conducted by the multiplexer; i.e., latch and sample data signal conducted from the data input terminal during the normal operation mode, and, on the other hand, latch and sample scan input signal conducted from the scan input terminal during the scan test mode.

To implement normal operation functions of an integrated circuit, the data input terminal of each scan flip-flop may be coupled to a logic block responsible for the normal operation functions; on the other hand, the scan input terminal may be coupled to an output terminal of another scan flip-flop, such that different scan flip-flops may be serially coupled as a scan chain for transmitting information related to a scan test. Please refer to FIG. 1 illustrating an architecture example of a typical digital circuit; this example may include two flip-flops FF[1] and FF[2], both are scan flip-flops; each flip-flop FF[.] may include terminals D, SI, SE, CK and Q, respectively as a data input terminal, a scan input terminal, a scan enabling terminal, a clock terminal and an output terminal. A terminal Q0 may be coupled to the terminal D of the flip-flop FF[1] via a logic block LOGIC[1], and a terminal Q1 from the terminal Q of the flip-flop FF[1] may be coupled to a subsequent flip-flop FF[2] via another logic block LOGIC[2], such that a data path of the normal operation mode may be established. On the other hand, to support the scan test mode, the terminal Q0 may be further coupled to the terminal SI of the flip-flop FF[1], and the terminal Q1 may be further coupled to the terminal SI of the flip-flop FF[2], such that a data path of the scan test mode, i.e., the scan chain, may be formed.

FIG. 1 also shows a typical architecture of a scan flip-flop, which includes transistors Tp1 to Tp6 (e.g., p-channel MOS transistors), transistors Tn1 to Tn6 (e.g., n-channel MOS transistors), and inverters 10a and 10b, 12a and 12b, 14a and 14b, as well as 16 and 18. The clock received by the terminal CK is inverted by the inverter 10a and outputted to a terminal CKB, and a clock at the terminal CKB is inverted by the inverter 18 and outputted to a terminal CKI; the signal at the terminal SE is inverted by the inverter 18 and outputted to a terminal SEB. The transistors Tp1 to Tp4 and Tn1 to Tn4 form a multiplexer 32. The transistors Tp5 to Tp6, Tn5 to Tn6, the inverters 12a and 12b, the inverters 12b and 14b controlled by the terminals CKI and CKB, as well as the inverter 16, collectively form a flip-flop circuit 34, which has a node 0 as an internal terminal, and outputs to the terminal Q. When the flip-flop FF[1] operates under the scan test mode, the terminal SE is raised to high level (logic 1), so the transistors Tn2 and Tp2 are turned on to conduct, and a voltage at the node n0 can therefore be controlled by the signal at the terminal SI, allowing the flip-flop circuit 34 to receive the signal from the scan chain; on the other hand, the transistors Tp3 and Tn3 are turned off and stops conducting. When the flip-flop FF[1] works under the normal operation mode, the terminal SE is pulled down to low level (logic 0), hence the transistors Tn3 and Tp3 are turned on; accordingly, a voltage at the node n0 can be controlled by the signal at the terminal D, allowing the flip-flop circuit 34 to receive the signal of normal operation; on the other hand, the transistors Tp2 and Tn2 are turned off.

In FIG. 1, a clock CKin is utilized to trigger the flip-flop circuits (e.g., the flip-flop circuit 34) of the flip-flops FF[1] and FF[2]. However, due to signal delays respectively introduced by the logic circuits LOGIC[1] and LOGIC[2], actual triggering clocks CK[1] and CK[2] respectively received at the terminals CK of the flip-flops FF[1] and FF[2] have be accordingly tuned, wherein delayers CTSD[1] and CTSD[2] respectively represent clock delays deliberately introduced by clock tree synthesis. However, delays along the scan chain and delays alone the data path of the normal operation mode are different (the former are usually shorter); the clocks determined according to demands of the normal operation functions will cause the scan flip-flops to violate timing specifications of the scan test mode, e.g., to violate hold-time requirement. Similarly, if the clocks of the scan flip-flops are tuned according to timing of the scan test, then the normal operation functions will be influenced. To overcome timing violation of scan flip-flops, a known art is inserting additional delayer buffers along the scan chain, such as the buffers BUFF[1] and BUFF[2] shown in FIG. 1. However, inserting buffers also expands total area of the integrated circuit, degrades integrity of the integrated circuit, increases power consumption, lengthens routing distance, and decreases flexibility of scan reordering (reordering the scan chain).

For satisfying both timing of normal operation and timing of scan chain, IC design flow usually needs to repeat many iterations to seek a balance between timing of normal operation and timing of scan chain, consequently consumes significant design time, cost and resource to insert many buffers to integrated circuit, and sometimes even fails to converge to a result capable of satisfying both timing demands. For advanced fabrication of small dimension, because of shorter delay from the terminals CK to Q, shorter data setup time, greater variation between timing of different chips, and higher uncertainty of clock, influence of hold-time violation becomes severer, and therefore becomes a major challenge of circuit design.

Some prior arts attempt to embed scan chain delay into scan flip-flop, such as U.S. Pat. Nos. 6,389,566, 6,895,540 and 7,649,395. However, these prior arts still suffer disadvantages, such as: number of output terminals incompatible to standard cell, greater layout overhead, lower delay efficiency (delay per unit area) to delay scan chain, and/or failure to correctly operate under low supply voltage utilized in modern advance fabrication process.

SUMMARY OF THE INVENTION

An objective of the invention is providing a scan flip-flop (e.g., 30 in FIG. 2), which may include a data input terminal (e.g., D in FIG. 2) coupled to a data signal, a scan input terminal (e.g., SI in FIG. 2) coupled to a scan input signal, and a flip-flop circuit (e.g., 38 in FIG. 2); and may further include: a first transistor (e.g., P1 in FIG. 2), a plurality of second transistors (e.g., Mp[1] to Mp[4] in FIG. 2), a third transistor (e.g., P3 in FIG. 2), a fourth transistor (e.g., N1 in FIG. 2), a plurality of fifth transistors (e.g., Mn[1] to Mn[4]) and a sixth transistor (e.g., N3 in FIG. 2), so as to jointly form a multiplexer (e.g., 36 in FIG. 2).

The first transistor may include a first gate, a first source and a first drain; each second transistor may include a second gate, a second source and a second drain; the third transistor may include a third gate, a third source and a third drain; the fourth transistor may include a fourth gate, a fourth source and a fourth drain; each fifth transistor may include a fifth gate, a fifth source and a fifth drain; the sixth transistor may include a sixth gate, a sixth source and a sixth drain. The flip-flop circuit may include a first internal input terminal and a second internal input terminal (e.g., at nodes n1a and n1b, FIG. 2). Those second sources and second drains, along with the first source and first drain, may be serially coupled between a first voltage (e.g., Vdd in FIG. 2) and the first internal input terminal; the first gate may be coupled to the scan input terminal, and the second gates may be commonly coupled to a first enabling signal (e.g., at terminal SEB, FIG. 2). The third source and the third drain may be coupled between the first internal input terminal and the data input terminal, and the third gate may be coupled to a second enabling signal (e.g., at terminal SE, FIG. 2); wherein the second enabling signal and the first enabling signal are of opposite phases. Those fifth sources and fifth drains, along with the fourth source and the fourth drain, may be serially coupled between a second voltage (e.g., G in FIG. 2) and the second internal input terminal; the fourth gate may be coupled to the scan input terminal, and the fifth gates may be commonly coupled to the second enabling signal. The sixth source and the sixth drain may be coupled between the second internal input terminal and the data input terminal, and the sixth gate may be coupled to the first enabling signal.

An objective of the invention is providing a method (e.g., flowchart 100 in FIG. 4) for a circuit layout, which may include: placing a plurality of first kind scan flip-flops (e.g., FF[k1] to FF[k4] in FIG. 4) in the circuit layout, and reserving an associated adjacent vacant region (e.g., A[k] in FIG. 4) aside each (e.g., FF[k] in FIG. 4) of the plurality of first kind scan flip-flops; performing a scan tree synthesis (e.g., 106 in FIG. 4) to provide a clock for each of the plurality of first kind scan flip-flops, performing a timing test on the plurality of first kind scan flip-flops by computer, and accordingly selecting a first number of to-be-replaced flip-flops (e.g., FF[k1] and FF[k3] in FIG. 4) from the plurality of first kind scan flip-flops; and, performing a replacement step (e.g., 110 in FIG. 4) by replacing each of the first number of to-be-replaced flip-flops with a second kind scan flip-flop (e.g., eFF[k1] or eFF[k3] in FIG. 4); wherein an area of each second kind scan flip-flop (e.g., eFF[k] in FIG. 4) may be greater than an area of each first kind scan flip-flop (e.g., FF[k] in FIG. 4); a total area of each first kind scan flip-flop and the associated vacant region may cover the area of each second kind scan flip-flop.

Each second kind scan flip-flop may include a data input terminal (e.g., D in FIG. 2), a scan input terminal (e.g., SI in FIG. 2), a flip-flop circuit (e.g., 38 in FIG. 2) which may include an internal terminal (e.g., at node n1a), as well as a first transistor (e.g., P1 in FIG. 2) and a plurality of second transistors (e.g., Mp[1] to Mp[4] in FIG. 2). Drains and sources of the first transistor and the second transistors may be serially coupled between a first voltage (e.g., Vdd in FIG. 2) and the first input terminal; a gate of the first transistor may be coupled to the scan input terminal, and gates of the second transistors may be commonly coupled together. The method of the invention may also include a scan reordering.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 2:
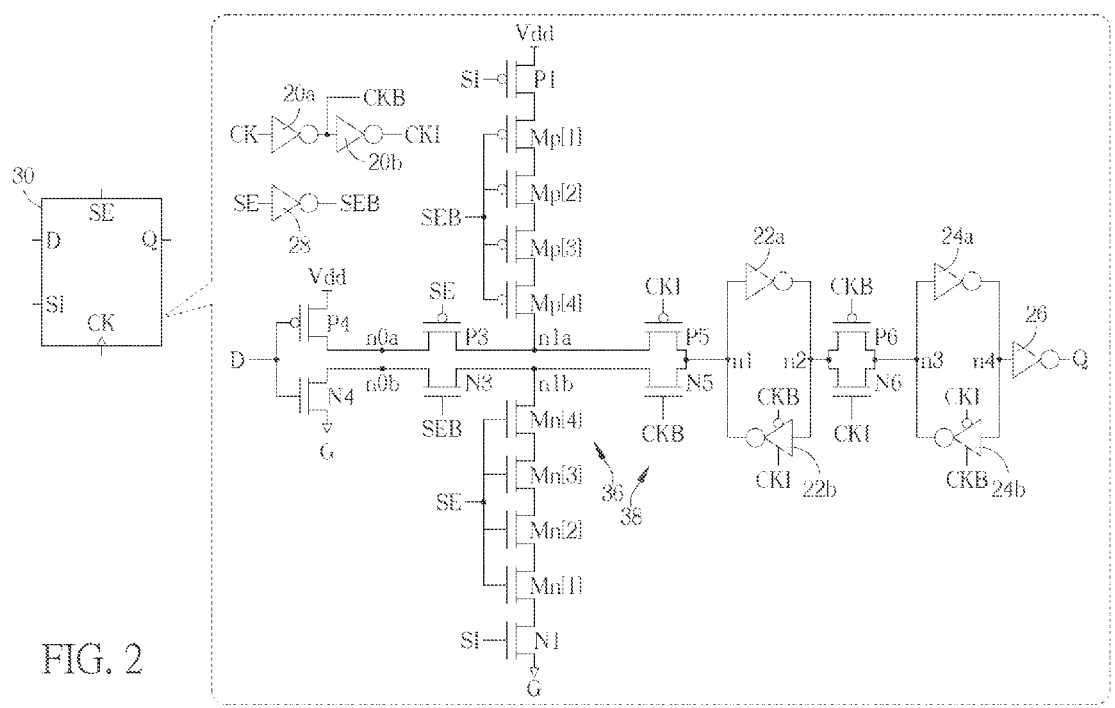
FIG. 2 illustrates a scan flip-flop according to an embodiment of the invention.

Please refer to FIG. 2 illustrating a flip-flop 30 according to an embodiment of the invention. The flip-flop 30 may be a scan flip-flop, operate between DC supply voltages Vdd and G (e.g., ground), and have terminals D, SI, SE, CK and Q as a data input terminal, a scan input terminal, a scan enabling terminal, a clock terminal and an output terminal. The flip-flop 30 may include: inverters 20a and 20b, 22a and 22b, 24a and 24b, 26 and 28; transistors (e.g., p-channel MOS transistors) P1 and P3 to P6, as well as transistors (e.g., n-channel MOS transistors) N1 and N3 to N6; the flip-flop 30 may also include a plurality of transistors Mp[1], Mp[2], ... etc., which may be exemplified by the transistors Mp[1] to Mp[4] in FIG. 2; furthermore, the flip-flop 30 may include a plurality of transistors Mn[1], Mn[2], ... etc., such as the transistors Mn[1] to Mn[4] in FIG. 2. Each transistor Mp[.] may be a p-channel MOS transistor, and each transistor Mn[.] may be an n-channel MOS transistor. A clock received by the terminal CK may be inverted by the inverter 20a and outputted to a terminal CKB, the clock at the terminal CKB may be inverted by the inverter 20b and outputted to a terminal CKI; a signal (e.g., a second enabling signal) at the terminal SE may be inverted by the inverter 28 and outputted to a terminal SEB (e.g., as a first enabling signal with a phase opposite to that of the second enabling signal).

In the flip-flop 30, the transistors P1, Mp[.] (e.g., Mp[1] to Mp[4]), P3, N1, Mn[.] (e.g., Mn[1] to Mn[4]) and N3 may respectively be regarded as first to sixth transistors, and jointly form a multiplexer 36 along with the transistors P4 and N4. The transistors P5, P6, N5, N6 and the inverters 22a, 24a, 22b, 24b and 26 may form a master-slave flip-flop circuit 38; nodes n1a and n1b may be regarded as two internal input terminals of the flip-flop circuit 38.

In the multiplexer 36, gates of the transistors P1 and N1 may be coupled to the terminal SI, gates of the transistors Mp[.] (e.g., Mp[1] to Mp[4]) may be commonly coupled to the terminal SEB, gates of the transistors Mn[.] (e.g., Mn[1] to Mn[4]) may be commonly coupled to the terminal SE. Sources and drains of the transistors P1 and Mp[.] may be serially coupled between the voltage Vdd and the node n1a to form a cascode structure; similarly, sources and drains of the transistors N1 and Mn[.] may be serially coupled between the voltage G and the node n1b. For example, assuming that the flip-flop 30 includes a number Kp of transistors Mp[1] to Mp[Kp], then the source of the k-th transistor Mp[k] may be coupled to the drain of the transistor Mp[k−1] (for k=2 to Kp), the source of the transistor Mp[1] may be coupled to the drain of the transistor P1, the source of the transistor P1 may be coupled to the voltage Vdd, and the drain of the transistor Mp[Kp] may be coupled to the node n1a. Similarly, assuming that the flip-flop 30 includes a number Kn of transistors Mn[1] to Mn[Kn], then the source of the k-th transistor Mn[k] may be coupled to the drain of the transistor Mn[k−1] (for k=2 to Kn), the source of the transistor Mn[1] may be coupled to the drain of the transistor N1, the source of the transistor N1 may be coupled to the voltage G, and the drain of the transistor Mn[Kn] may be coupled to the node n1b. A gate, a source and a drain of the transistor P4 may respectively be coupled to the terminal D, the voltage Vdd and a node n0a; a gate, a source and a drain of the transistor N4 may respectively be coupled to the terminal D, the voltage G and a node n0b. A source and a drain of the transistor P3 may be coupled between the nodes n0a and n1a, and a gate of the transistor P3 may be coupled to the terminal SE; a source and a drain of the transistor N3 may be coupled between the nodes n0b and n1b, and a gate of transistor N3 may be coupled to the terminal SEB.

When the flip-flop 30 works in a normal operation mode, a signal at the terminal SE may be kept equal to logic 0 (e.g., a low level as the voltage G), and a signal at the terminal SEB may therefore equal logic 1 (e.g., a high level as the voltage Vdd); accordingly, the transistors P3 and N3 may be turned on to conduct, allowing signals at the nodes n1a and n1b to be controlled by a signal at the terminal D (e.g., a data signal); equivalently, the normal operation data signal at the terminal D is allowed to be transmitted to the flop-flop circuit 38 via the transistors P4 and N4; on the other hand, the transistors Mp[.] and Mn[.] may be turned off to stop conducting, so a signal at the terminal SI (e.g., a scan input signal) may not be conducted to the nodes n1a and n1b. When the flip-flop 30 works in a scan test mode, the signal at the terminal SE may be kept equal to logic 1, and then the signal at the terminal SEB may equal logic 0; in response, the transistors P3 and N3 may be turned off to stop conducting, so the signal at the terminal D may not be conducted to the multiplexer 38; all the transistors Mp[.] and Mn[.] may be turned on to conduct, allowing the signals at the nodes n1a and n1b to be controlled by the signal at the terminal SI; equivalently, the scan input signal at the terminal SI is allowed to be transmitted to the flop-flop circuit 38 via the transistors P1 and N1.

In the flip-flop circuit 38, gates of the transistors P5 and N5 may respectively be coupled to the terminal CKI and CKB; a source and a drain of the transistor P5 may be coupled between the nodes n1a and n1; and, a source and a drain of the transistor N5 may be coupled between the nodes n1b and n1. An input and an output of the inverter 22a may respectively be coupled to the nodes n1 and n2; the inverter 22b may be enabled and disabled by clocks at the terminals CKI and CKB, and, an input and an output of the inverter 22b may respectively be coupled to the nodes n2 and n1. Gates of the transistors P6 and N6 may respectively be coupled to the terminals CKB and CKI; a source and a drain of the transistor P6 may be coupled between the nodes n2 and n3; and, a source and a drain of the transistor N6 may be coupled between the nodes n2 and n3. An input and an output of the inverter 24a may respectively be coupled to the nodes n3 and n4; the inverter 24b may be enabled and disabled by the clocks at the terminals CKI and CKB, and, an input and an output of the inverter 24b may respectively be coupled to the nodes n4 and n3. An input and an output of the inverter 26 may respectively be coupled to the node n4 and the terminal Q.

When the clock at the terminal CKI is logic 0, the clock at the terminal CKB may be logic 1, so the transistors P5 and N5 may be turned on to conduct, allowing the signals at the nodes n1a and n1b to be conducted to the node n1, and transmitted to the node n2 via the inverter 22a; the transistors P6 and N6 may be turned off to stop conducting, so the signal at the terminal Q will not be affected by the node n2. When the clock at the terminal CKI transits to logic 1, the clock at the terminal CKB may accordingly transit to logic 0, so the transistors P5 and P6 may stop conducting, and the signal states of the nodes n1a and n1b, right at the transition, may be latched between the inverters 22a and 22b; the transistors P6 and N6 may conduct, allowing the signal at the node n2 to be conducted to the node n3, and transmitted to the terminal Q via the inverters 24a and 26.

Because the multiplexer 36 is equipped with multiple stacked transistors Mn[.] and Mp[.] according to the invention, delay from the terminal SI to the flip-flop circuit 38 may be effectively increased, equivalently, delay along scan chain may be increased. Therefore, the flip-flop 30 according to the invention may provide an effectively solution to hold-time violation of scan chain. The flip-flop 30 not only may improve scan chain timing violation for the scan test mode, but also may maintain signal timing of the normal operation mode; because the transistors Mn[.] and Mp[.] are serially coupled in cascode, so a resistance at each of the nodes n1a and n1b may be equivalent to a drain resistance of a single transistor. That is, during normal operation, the resistance interfacing the signal D at the nodes n1a and n1b may be kept equal to a resistance of the multiplexer 32 in FIG. 1; therefore, normal operation timing of the flip-flop 30 in FIG. 2 may be substantially identical to that of the flip-flop FF[.] in FIG. 1. Comparing to the scan flip-flops of various prior arts, the flip-flop 30 according to the invention may provide longer scan chain delay by smaller area overhead; in other words, by adopting the flip-flop 30, delay time provided by each unit area may be longer than those provided by the prior arts, hold-time violation may be solved more effectively, and usage of buffers may be further reduced, so as to decrease area and power consumption of IC, increase integrity, and lower time, cost and resource of IC design.

Figure 3:
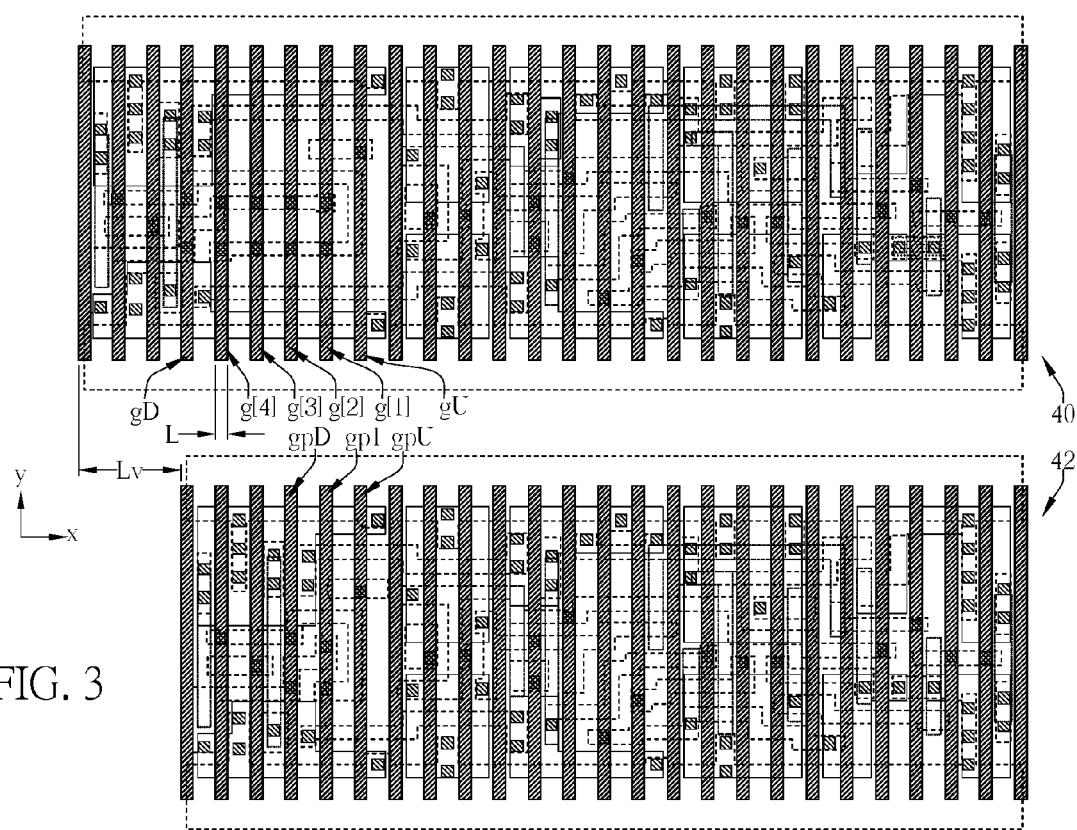
FIG. 3 illustrates a layout according to an embodiment of the invention, which may implement the scan flip-flop shown in FIG. 2.

Please refer to FIG. 3 illustrating a layout 40 according to an embodiment of the invention, which may be a layout of 28 nm fabrication process, and may be adopted to implement the flip-flop 30 in FIG. 2. The layout 40 may include multiple gate regions distributed along x-axis evenly by equal separation distances; these gate regions may be of an equal length L (dimension along x-axis), and formed by a same conductor layer, e.g., a poly-silicon layer. In those gate regions, a gate region gU may implement the gates of the transistors P1 and N1, each gate region g[k] (e.g., for k=1 to 4) may implement the gates of the transistor pair Mp[k] and Mn[k], and a gate region gD may form the gates of the transistor pair P3 and N3. FIG. 3 also illustrates another layout 42 of the same fabrication process, which may be adopted to implement the flip-flop FF[.] in FIG. 1. Similar to the layout 40, the layout 42 may also include multiple gate regions evenly distributed along x-axis by equal distance, such as the gate regions gpU, gp1 and gpD, etc. The gate region gpU may implement the gates of the transistors Tp1 and Tn1 (FIG. 1), the gate region gp1 may implement the gates of the transistors Tp2 and Tn2, and the gate region gpD may implement gates of the transistors Tp3 and Tn3.

Figure 1:
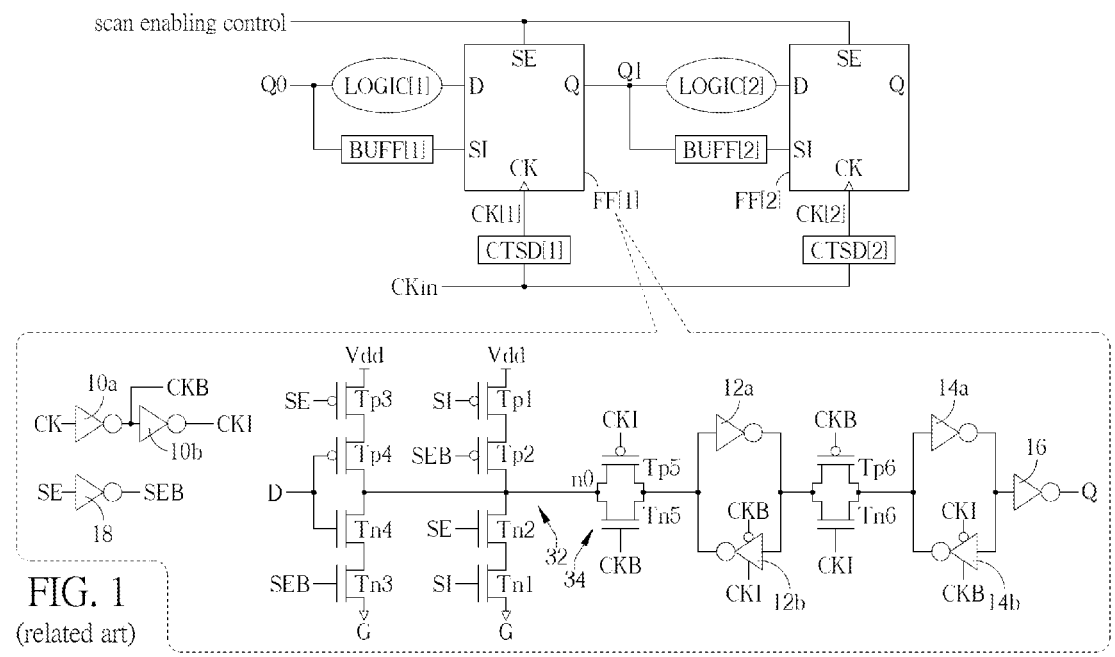
FIG. 1 (prior art) illustrates a typical scan flip-flop and its application.

Comparing to the flip-flop FF[.] in FIG. 1, the flip-flop 30 in FIG. 2 includes additional stacked transistors Mp[.] and Mn[.], so the length of the layout 40 is longer than that of the layout 42 by an interval Lv, as shown in FIG. 3. However, in advanced fabrication process, there is no need to arrange dummy gate region(s) between adjacent gate regions gU, g[1] to g[4] and gD of the transistors P1, Mp[.] and P3, N1, Mn[.] and N3, therefore the flip-flop 30 may efficiently increase delay time per unit area. In an embodiment, the additional interval Lv of the layout 40 may be three pitches, but may therefore increase a delay time of 70 ps, hence delay per unit area is much better (longer) than the prior arts.

Figure 4:
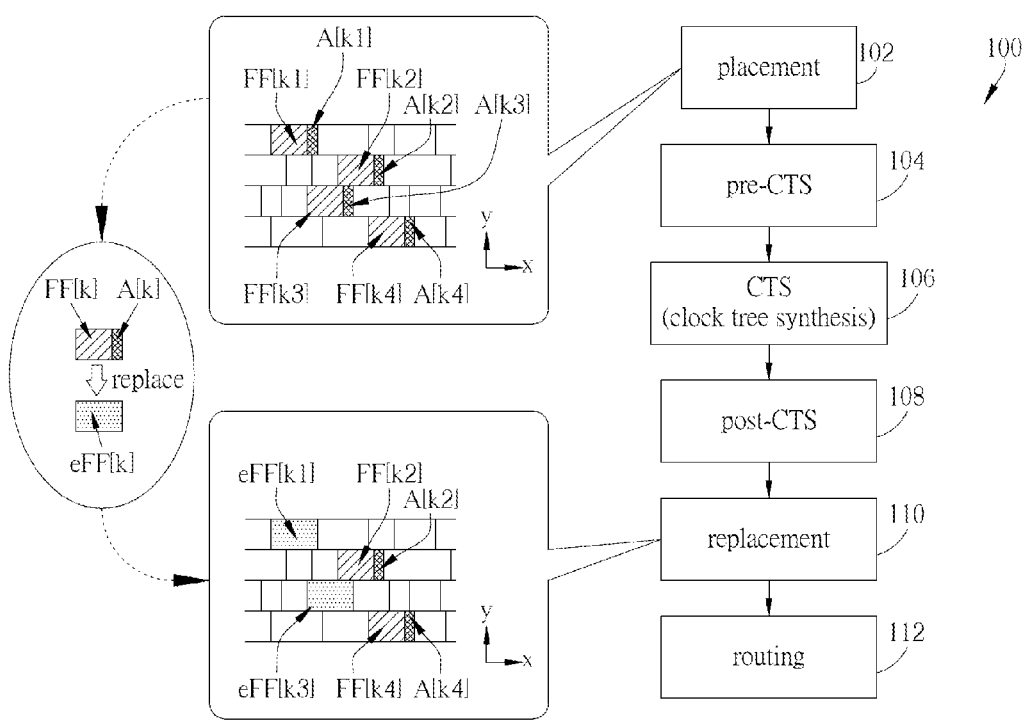
FIG. 4 illustrates a flowchart according to an embodiment of the invention.

The flip-flop 30 (e.g., the layout 40) of the invention, along with the flip-flop FF[.] (e.g., the layout 42) shown in FIG. 1, may both be included in a standard cell library to be different kinds of standard cells. Please refer to FIG. 4 illustrating a flowchart 100 according to an embodiment of the invention, which may adopt the flip-flop 30 of the invention during IC design flow. Major steps of the flowchart 100 may be explained as follows.

Step 102: place instances of standard cells in the layout of an IC. At each location where a scan flip-flop should be placed, place a flip-flop FF[.] shown in FIG. 1, and reserve an associated vacant region A[.]. For example, assuming a portion of the entire IC layout needs four scan flip-flops, so four flip-flops FF[k1], FF[k2], FF[k3] and FF[k4] are placed during step 102, and an associated adjacent vacant region A[k1] is reserved aside the flip-flop FF[k1], an associated adjacent vacant region A[k2] is reserved aside the flip-flop FF[k2], an associated adjacent vacant region A[k3] is reserved aside the flip-flop FF[k3], and an associated adjacent vacant region A[k4] is reserved aside the flip-flop FF[k4]. The length of each region A[.] may be longer than, or equal to, the interval Lv (in FIG. 3).

Steps 104, 106 and 108: respectively perform pre-CTS, CTS (clock tree synthesis) and post-CTS on the placed instances of standard cells.

Step 110: perform a timing test on the result of CTS, and accordingly selecting to-be-replaced flip-flops from the placed scan flip-flops. The timing test may include hold-time test, so as to find which flip-flops FF[.] violates hold-time requirement, and the flip-flops suffering hold-time violation are regarded as the to-be-replaced flip-flops. After the to-be-replaced flip-flops are found, perform a replacement step by replacing each to-be-replaced flip-flop FF[.] with a scan flip-flop eFF[.] of the invention, i.e., an instance of the flip-flop 30 shown in FIG. 2. Because the heights (dimension alone y-axis) of the flip-flops FF[.] and eFF[.] may be identical, and the length (alone x-axis) of the region A[.] may cover the interval Lv, so the layout of the flip-flop eFF[.] may be completely covered by a total (union) region of the flip-flop FF[.] and the vacant region A[.]. In the example of FIG. 4, assuming that the flip-flops FF[k1] and FF[k3] are to-be-replaced flip-flops, then, during step 110, a flip-flops eFF[k1] may be inserted to a region originally occupied by the flip-flop FF[k1] and A[k1], and an original layout of the flip-flop FF[k3] and the vacant region A[k3] may be replaced by a layout of the flip-flop eFF[k3]. Other vacant regions A[.] which do not need to be replaced, such as the vacant regions A[k2] and A[k4], may be utilized to place other element(s) or cell(s), e.g., buffer(s) and decoupling capacitor(s).

Step 112: continue the design flow by performing routing on the resultant IC layout of step 110.

The steps of the flowchart 100 may be performed automatically by computer. Because the flip-flop according to the invention may effectively increase hold-time margin, then may also expand flexibility of reordering scan chain, and the flowchart 100 may further include a step to perform scan reordering, e.g., between steps 102 and 104.

To sum up, comparing to prior arts, the scan flip-flop according to the invention may efficiently expand delay time per unit area, effectively improve hold-time violation, substantially reduced required buffers, power consumptions, routing length and layout area of IC, and enhance efficiency of IC design, so the design flow may satisfy timing demands of both the normal operation and scan chain, quickly converge to solution(s) without compromising any timing demands, and reduce time, cost and resource of the design flow.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A scan flip-flop, comprising:
   a data input terminal coupled to a data signal;
   a scan input terminal coupled to a scan input signal;
   an internal circuit comprising a first internal input terminal, capable of latching an internal signal received via the first internal input terminal in response to a clock;
   a first transistor comprising a first gate, a first source and a first drain; and
   a plurality of second transistors, each of the plurality of second transistors comprising a second gate, a second source and a second drain; and
   a third transistor comprising a third gate, a third source and a third drain, the third source and the third drain being coupled between the first internal input terminal and the data input terminal, and the third gate being coupled to a second enabling signal;
   wherein the second sources and the second drains of the plurality of second transistors, and the first source and the first drain, are serially coupled between a first voltage and the first internal input terminal, the first gate is coupled to the scan input terminal, and the second gates of the plurality of second transistors are commonly coupled to a first enabling signal, and
   wherein the second enabling signal and the first enabling signal are of opposite phases.

2. The scan flip-flop of claim 1, wherein the internal circuit further comprises a second internal input terminal, and the scan flip-flop further comprises:
   a fourth transistor comprising a fourth gate, a fourth source and a fourth drain; and
   a plurality of fifth transistors, each of the plurality of fifth transistors comprising a fifth gate, a fifth source and a fifth drain;
   wherein the fifth sources and the fifth drains of the plurality of fifth transistors, and the fourth source and the fourth drain, are serially coupled between a second voltage and the second internal input terminal, the fourth gate is coupled to the scan input terminal, and the fifth gates of the plurality of fifth transistors are commonly coupled to the second enabling signal.

3. The scan flip-flop of claim 2 further comprising:
a sixth transistor comprising a sixth gate, a sixth source and a six drain, the sixth source and the sixth drain being coupled between the second internal input terminal and the data input terminal, and the sixth gate being coupled to the first enabling signal.

\* \* \* \* \*